United States Patent [19]
Blodgett

[11] Patent Number: 5,646,570
[45] Date of Patent: Jul. 8, 1997

[54] APPARATUS FOR BIASING A FIELD EFFECT TRANSISTOR WITH A SINGLE VOLTAGE SUPPLY

[75] Inventor: James Russell Blodgett, Derry, N.H.

[73] Assignee: Lucent Technologies Inc., Murray Hill, N.J.

[21] Appl. No.: 529,888

[22] Filed: Sep. 18, 1995

Related U.S. Application Data

[63] Continuation-in-part of Ser. No. 311,224, Sep. 23, 1994, Pat. No. 5,483,191.
[51] Int. Cl.$^6$ .................................................. H03L 5/00
[52] U.S. Cl. ..................... 327/362; 327/306; 327/389; 327/432; 327/434
[58] Field of Search ............................ 327/108, 306, 327/334, 362, 389, 432, 434, 560, 562

[56] References Cited

U.S. PATENT DOCUMENTS

| | | | |
|---|---|---|---|
| 4,179,668 | 12/1979 | Schuermann | 330/277 |
| 4,255,714 | 3/1981 | Rosen | 329/103 |
| 4,342,967 | 8/1982 | Ragan et al. | 330/277 |
| 5,006,823 | 4/1991 | Baril et al. | 333/164 |
| 5,136,193 | 8/1992 | Pouysegur et al. | 307/568 |
| 5,276,406 | 1/1994 | Samay et al. | 330/277 |
| 5,329,249 | 7/1994 | Cripps | 330/302 |
| 5,406,225 | 4/1995 | Iida et al. | 330/279 |

*Primary Examiner*—Terry Cunningham
*Attorney, Agent, or Firm*—Jimmy Goo

[57] ABSTRACT

Embodiments of the present invention bias a field effect transistor with only a single voltage source and generally do not have the disadvantages of traditional "floated source" bias techniques. Furthermore, some embodiments of the present invention are capable of automatically compensating for the normal manufacturing variations that often result in the physical characteristics of individual FETs.

10 Claims, 3 Drawing Sheets

APPARATUS FOR BIASING A FIELD EFFECT TRANSISTOR WITH A SINGLE VOLTAGE SUPPLY

RELATED APPLICATIONS

This application is a continuation-in-part of U.S. patent application Ser. No. 08/311,224, filed Sep. 23, 1994, which is U.S. Pat. No. 5,483,191 and which is incorporated by reference as if set forth in its entirety.

FIELD OF THE INVENTION

The present invention relates to electronic circuit design in general, and more particularly, to methods and apparatus for biasing field effect transistors.

BACKGROUND OF THE INVENTION

In the prior art, transistors are often used as high-frequency amplifiers. In applications where the operating frequencies are below microwave frequencies (i.e., <2 GHz), silicon bipolar transistors are typically used. Although silicon bipolar transistors typically do not have performance characteristics as good as field effect transistors ("FETs"), bipolar transistors have the advantage that their associated bias circuitry is generally less complicated than that traditionally needed for FETs. In particular, it is well known how to bias silicon bipolar transistors with only a single voltage source.

In microwave frequency applications, FETs are more commonly used than bipolar transistors because FETs generally have better gain, noise and linearity characteristics than bipolar transistors. Even though FETs generally have better performance characteristics than bipolar transistors, the use of FETs in low frequency applications (i.e., <2 GHz) has not been common for two reasons. First, the performance characteristics of bipolar transistors, while generally not as good as that for FETs, are often satisfactory for many applications. And second, FETs are generally more expensive and difficult to use than bipolar transistors because FETs have required two disparate voltage sources to be properly biased. Although for some applications it is acceptable to "float" a FET (i.e., bias it with only one voltage source), this causes the performance of the FET to be substantially degraded.

FETs are typically biased to function as class-A amplifiers and as such, benefit from a constant drain current and drain to source voltage, regardless of the signal level. But because of manufacturing variations, certain physical characteristics of individual FETs (e.g., pinch-off voltage and transconductance) can vary and, therefore, additional circuitry may be necessary to compensate for these variations and thus ensure a constant drain current and drain to source voltage. Of course, there are some applications where variations in the physical characteristics of FETs are not a problem and can be safely ignored.

FIG. 1 is a schematic diagram of an amplifier circuit containing a FET and a feedback control system that maintains the drain current and voltage of the FET at specified levels, regardless of variations in the physical characteristics of the transistor. The drain current is sensed in a resistor, compared to a reference, and a negative gate bias is adjusted to yield the desired set of conditions. Some high performance applications use operational amplifiers to perform the feedback function. The fundamental concept, however, is the same. This type of bias circuit works well and is widely used. It's principal disadvantage is that it requires two voltage sources.

FIG. 2 is a schematic diagram a typical circuit that uses the "floated source" method of biasing a FET with only a single voltage source. Current through the source resistor effectively biases the FET gate negative relative to the source. The source is bypassed with a capacitor to ground so as to mitigate against negative feedback. While this technique is generally acceptable for low frequency applications, it is disadvantageous for high frequency applications because the performance of the circuits significantly degrades. Another disadvantage of the "floated source" technique is that variations in the physical characteristics of individual FETs, which occur in normal manufacturing, can result in unacceptable variations in the drain current and drain to source voltage.

Occasionally, these variations are partially compensated for by including in the circuit a variable resistor in series with the source (as shown in FIG. 2). Once the circuit is fabricated, the variable resistor is adjusted to so that the circuit yields the desired drain current. This fix is problematic, however, in that it results in variations in the drain to source voltage, which may be a critical parameter in some applications. Depending on the complexity of the circuitry and the sophistication of the designer, the variable resistor can be fabricated in numerous ways (e.g., a potentiometer, multiple wirebonded parallel resistors on a hybrid circuit, laser trimming of thin-film resistors, etc.). In all of these cases, however, the drain to source voltage remains variable.

SUMMARY OF THE INVENTION

Embodiments of the present invention bias a field effect transistor with only a single voltage source and generally do not have the disadvantages of traditional "floated source" bias techniques. Furthermore, embodiments of the present invention are capable of automatically compensating for normal manufacturing variations in the physical characteristics of individual FETs.

These results are obtained in an illustrative embodiment of the present invention that includes a field effect transistor, a bipolar transistor and a single voltage source in a topology shown in FIGS. 3, 4, 5 or 6.

DETAILED DESCRIPTION

Figure 1:
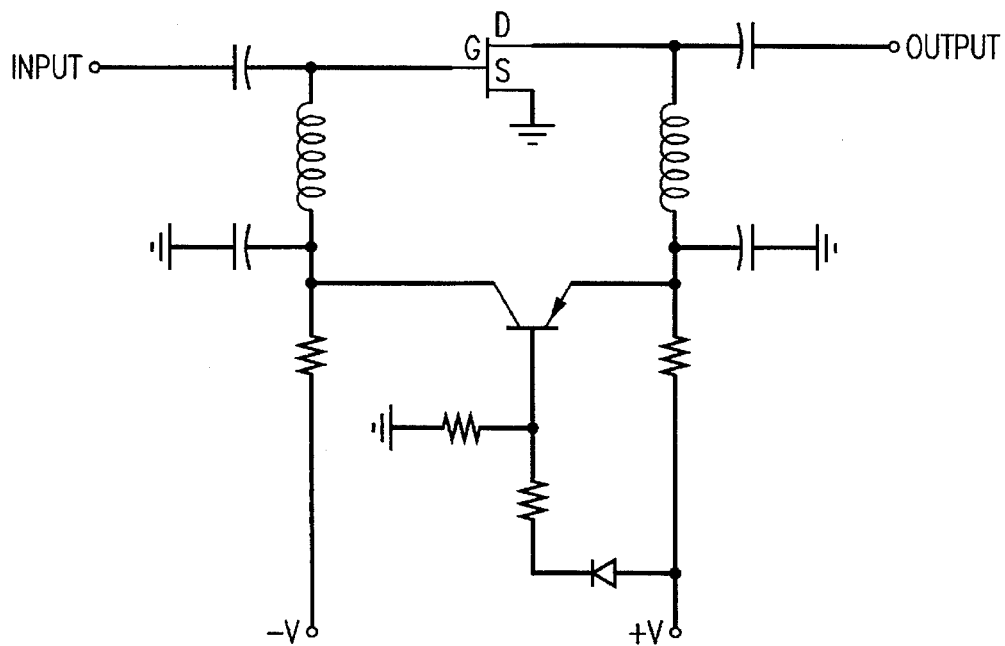
FIG. 1 depicts a schematic diagram of an electric circuit that biases a FET and that utilizes two voltage sources of opposite polarity.
Figure 2:
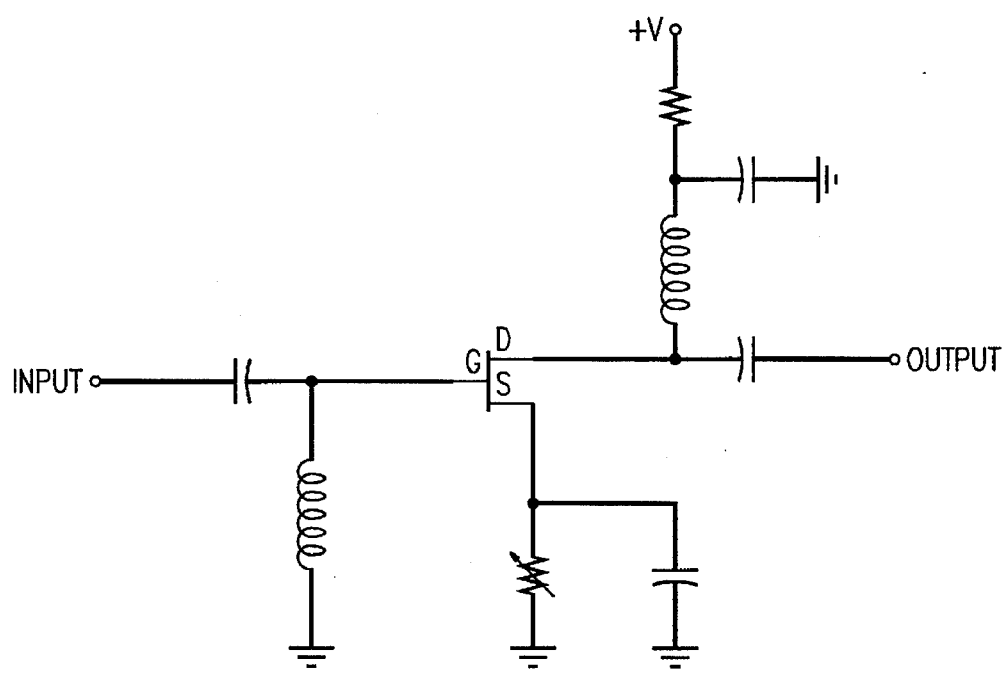
FIG. 2 depicts a schematic diagram of an electric circuit that uses the "floated source" method of biasing a FET.
Figure 3:
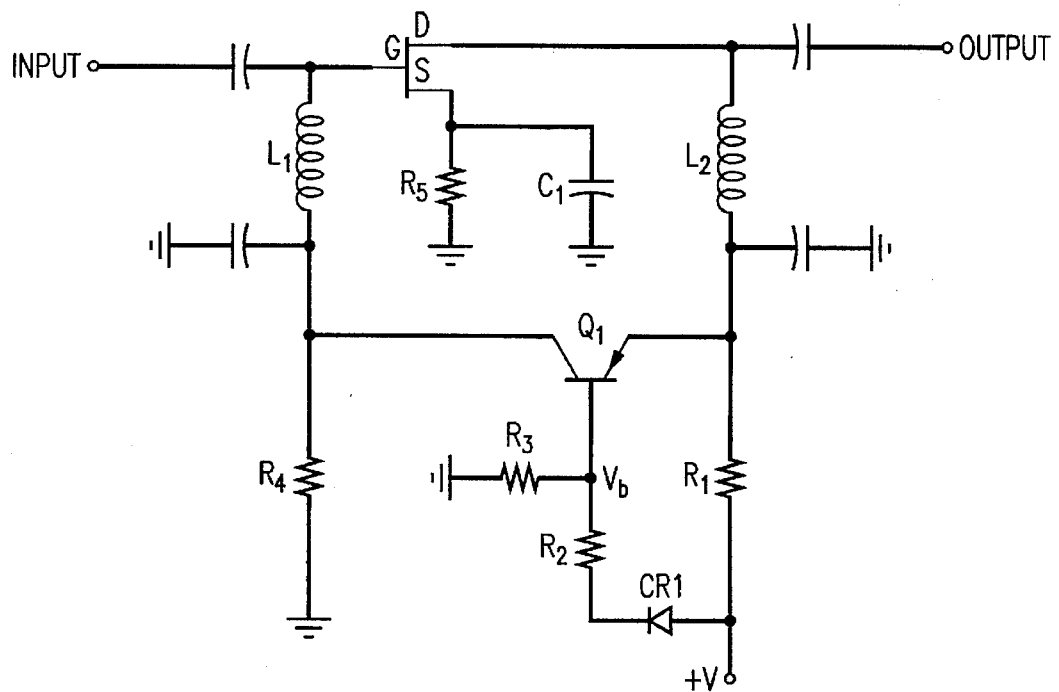
FIG. 3 depicts a schematic diagram of an illustrative embodiment of the present invention, which biases a FET with only one voltage source yet overcomes some of the disadvantages associated with the "floated source" method.

FIG. 3. depicts a schematic diagram of an illustrative embodiment of the present invention, which biases a FET with only a single voltage source. While the illustrative embodiment comprises only a single voltage source, it advantageously does not exhibit the limitations of the "floated source" technique described above. In addition to not requiring a negative supply voltage, it automatically adjusts for manufacturing variations in FETs and exhibits a constant drain to source voltage.

With the desired drain current flowing, a certain voltage is developed across the source resistor $R_S$. This resistor should be sized so that the resulting voltage developed across it is larger than the most negative gate to source voltage expected for the FET at the desired current. The desired drain current also develops a voltage across drain resistor $R_1$. This voltage is compared to a reference voltage, $V_b$, developed by CR1, $R_2$ and $R_3$ by bipolar transistor $Q_1$. A current through $Q_1$ will flow which places its emitter one $V_{be}$ drop (typically 0.65 volts) above the reference voltage. This current flowing through $R_4$ produces the gate bias voltage for the FET, thereby maintaining constant drain current. It should be noted that because the drain resistor R1 and the source resistor $R_S$ are fixed, the FET drain to source voltage, $V_{DS}$, will be constant regardless of the pinch-off voltage or transconductance of the FET. While diode CR1 is optional for circuits that operate solely within a limited temperature range, or where the minor temperature induced variations are acceptable, it is preferred that diode CR1 be incorporated into embodiments of the present invention. Diode CR1 is advantageous because it produces a temperature versus voltage characteristic that cancels the corresponding voltage versus temperature characteristic of the base-emitter junction of bipolar transistor Q1. In embodiments where diode CR1 is incorporated, it is preferred that diode CR1 be matched to the base-emitter junction of bipolar transistor $Q_1$.

For the embodiment depicted in FIG. 3, it is preferred that all four of the following conditions be satisfied:

$$I_D = \frac{V - V_b - 0.65}{R_1} \quad \text{(Eq. 1)}$$

$$V_{DS} = V - I_D(R_1 + R_S) \quad \text{(Eq. 2)}$$

$$V_b = (V - 0.65)\frac{R_3}{R_2 + R_3} \quad \text{(Eq. 3)}$$

$$0 \leq V_{GS} \leq I_D R_S \quad \text{(Eq. 4)}$$

Figure 4:
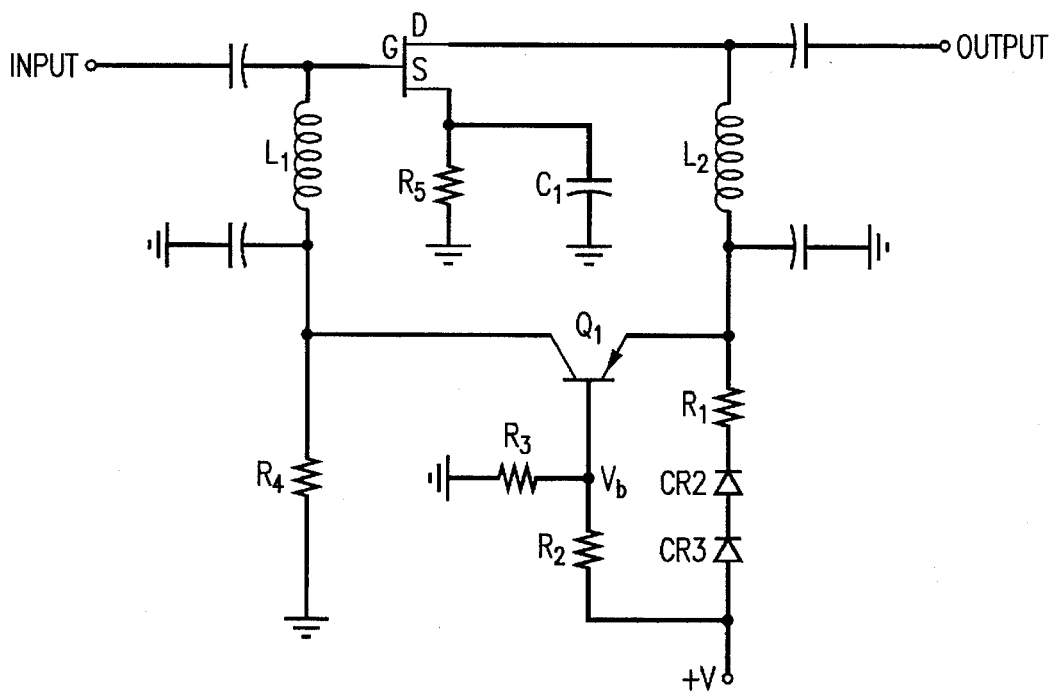
FIG. 4 depicts a schematic diagram of another illustrative embodiment of the present invention that is advantageous in wide-temperature range applications.

In applications where the circuit will operate solely within a limited temperature range, or where small temperature induced variations are acceptable, embodiments of the present invention can omit diode CR1. Alternatively, in wide-temperature range applications, where FETs tend to have decreasing gain with increasing temperature, FIG. 4 shows a schematic diagram of the present invention that mitigates the disadvantageous effects of operating over a wide temperature range. In particular, diode CR1 is omitted and zero, one, two or more diodes are added in series with resistor $R_1$. The purpose of adding one or more diodes in series with resistor $R_1$ is that it causes the drain current to increase linearly with temperature. Therefore, the specific number of diodes added to a particular embodiment will depend on the temperature vs. gain and current vs. temperature characteristics of the respective devices. This embodiment has the further advantage that using diodes to temperature compensate the circuit can also compensate other amplifier stages that are cascaded to the embodiment. All of the components for each of the embodiments can be selected from commercially available sources.

Figure 5:
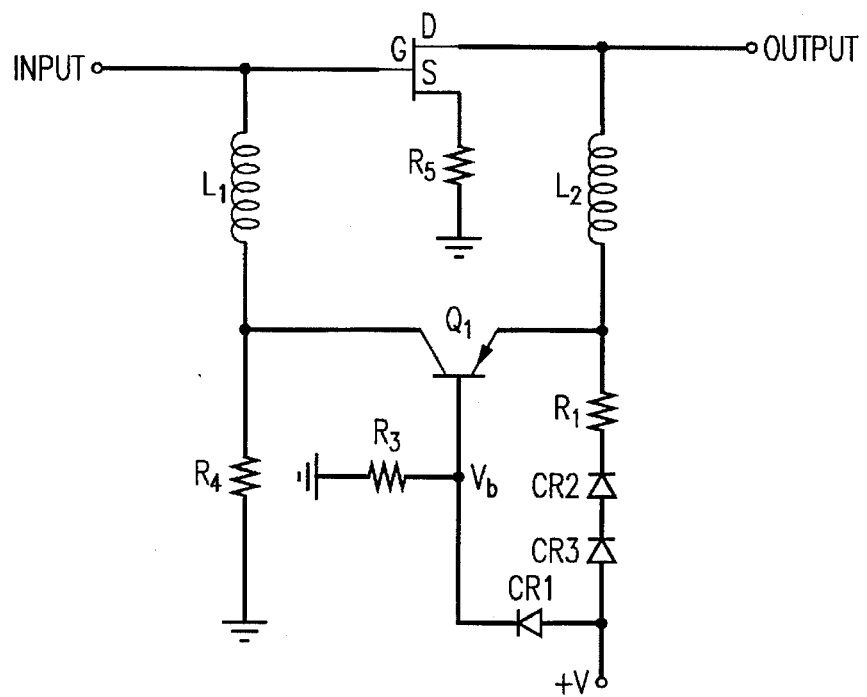
FIG. 5 depicts a schematic diagram of another illustrative embodiment of the present invention.
Figure 6:
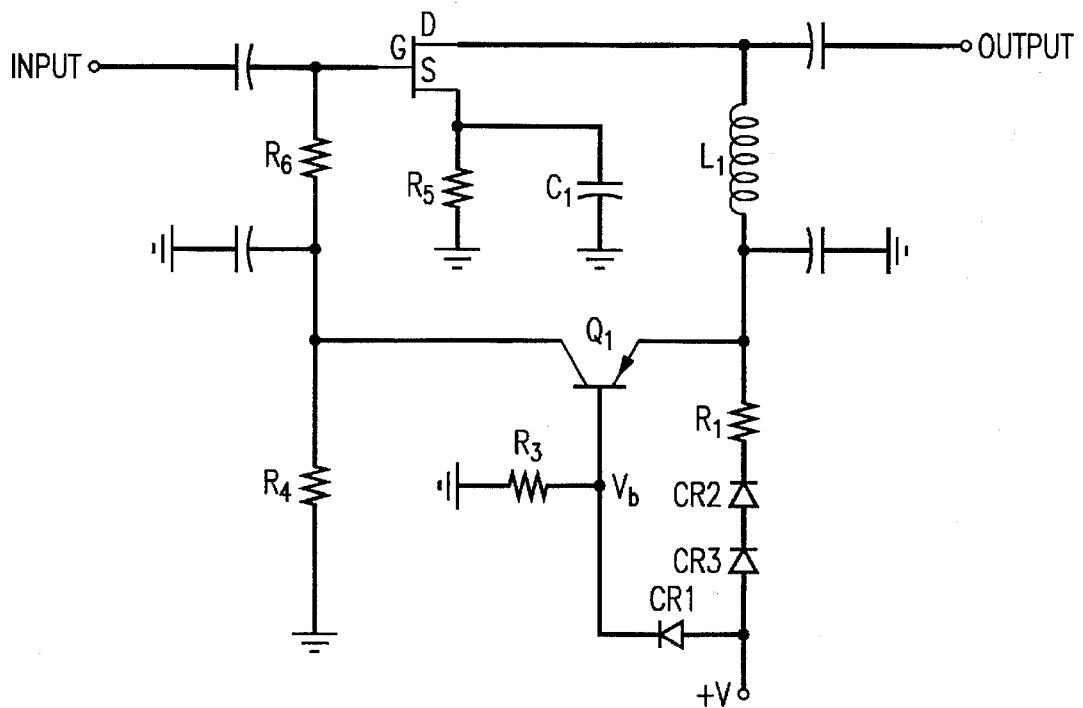
FIG. 6 depicts a schematic diagram of another illustrative embodiment of the present invention.

As shown in FIG. 5, in another illustrative embodiments, any or all of the capacitors, and especially capacitor $C_1$, can be eliminated when the circuit is designed to operate either at very high frequencies (because the capacitors effectively operate as short circuits) or at very low frequencies (because the capacitors effectively operate as open circuits). As shown in FIG. 6, in another embodiment of the present invention, choke $L_1$ can be replaced by a resistor (e.g., $R_6$); and in some embodiments, the resistor $R_2$ can be eliminated in cases where $R_3 \gg R_2$, because in such cases there will be little voltage drop across $R_2$. For the purposes of this specification it is to be understood that the term "choke" is a synonym for "inductor."

What is claimed is:

1. An apparatus for processing an electric signal, said apparatus comprising:

a field effect transistor having a gate lead, a drain lead and a source lead, wherein said gate lead is an input and said drain lead is an output;

a bipolar transistor having a base lead, a collector lead and an emitter lead, said base lead being connected to a voltage source;

a first choke $L_1$ having a first lead and a second lead, said first lead of said first choke being connected to said drain lead and said second lead of said first choke being connected to said emitter lead;

a first resistor $R_1$ having a first lead and a second lead, said first lead of said first resistor being connected to said emitter lead and said second lead of said first resistor being connected to said voltage source;

a second resistor $R_3$ having a first lead and a second lead, said first lead of said second resistor being connected to said base lead and said second lead of said second resistor being connected to ground;

a third resistor $R_4$ having a first lead and a second lead, said first lead of said third resistor being connected to said collector lead and said second lead of said third resistor being connected to ground;

a fourth resistor $R_5$ having a first lead and a second lead, said first lead of said fourth resistor being connected to said source lead and said second lead of said fourth resistor being connected to ground; and a fifth resistor $R_6$ having a first lead and a second lead, said first lead of said fifth resistor being connected to said gate lead and said second lead of said fifth resistor being connected to said collector lead.

2. The apparatus of claim 1 further comprising at least one diode, CR2, in series with said first resistor.

3. The apparatus of claim 1 further comprising at least two diodes, CR2 and CR3, in series with said first resistor.

4. An apparatus for processing an electric signal, said apparatus comprising:

a field effect transistor having a gate lead, a drain lead and a source lead, wherein said gate lead is an input and said drain lead is an output;

a bipolar transistor having a base lead, a collector lead and an emitter lead, said base lead being directly connected to a voltage source;

a first choke $L_1$ having a first lead and a second lead, said first lead of said first choke being connected to said gate lead and said second lead of said first choke being connected to said collector lead;

a second choke $L_2$ having a first lead and a second lead, said first lead of said second choke being connected to said drain lead and said second lead of said second choke being connected to said emitter lead;

a first resistor $R_1$ having a first lead and a second lead, said first lead of said first resistor being connected to said emitter lead and said second lead of said first resistor being connected to said voltage source;

a second resistor $R_3$ having a first lead and a second lead, said first lead of said second resistor being connected to said base lead and said second lead of said second resistor being connected to ground;

a third resistor $R_4$ having a first lead and a second lead, said first lead of said third resistor being connected to said collector lead and said second lead of said third resistor being connected to ground; and a fourth resistor $R_5$ having a first lead and a second lead, said first lead of said fourth resistor being connected to said source lead and said second lead of said fourth resistor being connected to ground.

5. The apparatus of claim 4 further comprising at least one diode, CR2, in series with said first resistor.

6. The apparatus of claim 4 further comprising at least two diodes, CR2 and CR3, in series with said first resistor.

7. An apparatus for processing an electric signal, said apparatus comprising:

a field effect transistor having a gate lead, a drain lead and a source lead, wherein said gate lead is an input and said drain lead is an output;

a bipolar transistor having a base lead, a collector lead and an emitter lead;

a first choke $L_1$ having a first lead and a second lead, said first lead of said first choke being connected to said gate lead and said second lead of said first choke being connected to said collector lead;

a second choke $L_2$ having a first lead and a second lead, said first lead of said second choke being connected to said drain lead and said second lead of said second choke being connected to said emitter lead;

a first resistor $R_1$ having a first lead and a second lead, said first lead of said first resistor being connected to said emitter lead and said second lead of said first resistor being connected to a voltage source;

a second resistor $R_3$ having a first lead and a second lead, said first lead of said second resistor being connected to said base lead and said second lead of said second resistor being connected to ground;

a diode $CR_1$ having a first lead and a second lead, said first lead of said diode being directly connected to said base lead and said second lead of said diode being directly connected to said voltage source;

a third resistor $R_4$ having a first lead and a second lead, said first lead of said third resistor being connected to said collector lead and said second lead of said third resistor being connected to ground; and a fourth resistor $R_5$ having a first lead and a second lead, said first lead of said fourth resistor being connected to said source lead and said second lead of said fourth resistor being connected to ground.

8. The apparatus of claim 7 wherein said diode $CR_1$ is matched to the base-emitter junction of said bipolar transistor.

9. An apparatus for processing an electric signal, said apparatus comprising:

a field effect transistor having a gate lead, a drain lead and a source lead, wherein said gate lead is an input and said drain lead is an output;

a bipolar transistor having a base lead, a collector lead and an emitter lead;

a first choke $L_1$ having a first lead and a second lead, said first lead of said first choke being connected to said drain lead and said second lead of said first choke being connected to said emitter lead;

a first resistor $R_1$ having a first lead and a second lead, said first lead of said first resistor being connected to said emitter lead and said second lead of said first resistor being connected to a voltage source;

a second resistor $R_3$ having a first lead and a second lead, said first lead of said second resistor being connected to said base lead and said second lead of said second resistor being connected to ground;

a diode $CR_1$ having a first lead and a second lead, said first lead of said diode being connected to said base lead and said second lead of said diode being connected to said voltage source;

a third resistor $R_4$ having a first lead and a second lead, said first lead of said third resistor being connected to said collector lead and said second lead of said third resistor being connected to ground;

a fourth resistor $R_5$ having a first lead and a second lead, said first lead of said fourth resistor being connected to said source lead and said second lead of said fourth resistor being connected to ground; and a fifth resistor $R_6$ having a first lead and a second lead, said first lead of said fifth resistor being connected to said gate lead and said second lead of said fifth resistor being connected to said collector lead.

10. The apparatus of claim 9 wherein said diode $CR_1$ is matched to the base-emitter junction of said bipolar transistor.

* * * * *